United States Patent
Yang (12)

(10) Patent No.: US 6,295,226 B1
(45) Date of Patent: Sep. 25, 2001

(54) MEMORY DEVICE HAVING ENHANCED PROGRAMMING AND/OR ERASE CHARACTERISTICS

(75) Inventor: Hsu Kai Yang, Pleasanton, CA (US)

(73) Assignee: Kaitech Engineering, Inc., Pleasonton, CA (US)

( * ) Notice: Subject to any disclaimer, the term of this patent is extended or adjusted under 35 U.S.C. 154(b) by 0 days.

(21) Appl. No.: 09/506,155

(22) Filed: Feb. 17, 2000

Related U.S. Application Data

(63) Continuation of application No. 09/178,300, filed on Oct. 23, 1998, now abandoned.

(51) Int. Cl.[7] .................................................. G11C 16/04
(52) U.S. Cl. ........................ 365/185.01; 365/104; 365/63
(58) Field of Search ............................. 365/185.28, 185.1, 365/185.01, 102, 63, 104

(56) References Cited

U.S. PATENT DOCUMENTS

| | | | | |
|---|---|---|---|---|
| 4,437,174 | * | 3/1984 | Masuoka | 365/218 |
| 4,612,212 | * | 9/1986 | Masuoka et al. | 427/91 |
| 4,910,565 | * | 3/1990 | Masuoka | 357/23.5 |
| 5,331,590 | | 7/1994 | Josephson et al. | |
| 5,761,116 | | 6/1998 | Li et al. | |
| 5,780,889 | * | 7/1998 | Sethi | 257/316 |

FOREIGN PATENT DOCUMENTS

| | | |
|---|---|---|
| 0 295 935 A1 | 12/1988 | (EP) . |
| 0 541 222 A2 | 5/1993 | (EP) . |
| 0 938 098 A2 | 8/1999 | (EP) . |
| WO 94/00881 | 1/1994 | (WO) . |
| WO 97/19453 | 5/1997 | (WO) . |

* cited by examiner

Primary Examiner—David Nelms
Assistant Examiner—Thong Le
(74) Attorney, Agent, or Firm—Trop, Pruner & Hu, P.C.

(57) ABSTRACT

A semiconductor memory device includes an erase line, a common line, and a first transistor coupled between the conductive line and the common line. The memory device includes a plurality of memory cells and bit lines, each memory cell including a program line, a memory transistor, and a tunneling capacitor having a first node coupled to the floating gate. A second transistor is coupled between the program line and another node of the tunneling capacitor. An access transistor is coupled to the memory transistor and the bit line. The second transistor may be a depletion-type transistor, as may be the first transistor that is coupled to the erase line. The memory cell may also be implemented as a single-polysilicon memory structure.

43 Claims, 8 Drawing Sheets

MEMORY DEVICE HAVING ENHANCED PROGRAMMING AND/OR ERASE CHARACTERISTICS

This application is a continuation application of U.S. Ser. No. 09/178,300, entitled "Semiconductor Memory Device," filed Oct. 23, 1998 now abandoned.

BACKGROUND

The invention relates to semiconductor memory devices.

Non-volatile memories have been used for many different applications. In microprocessor or microcontroller-based systems, for example, non-volatile memory devices may store boot-up code to initialize the systems during power-up sequences. In other electronic devices, non-volatile memory devices may be used to store information that would otherwise be lost if power is removed.

One type of non-volatile memory is the electrically erasable and programmable read-only memory (EEPROM). In an EEPROM, a memory cell typically includes a memory transistor having a floating gate that is capacitively coupled to a select gate. A thin oxide layer is typically formed between the floating gate and the drain of the memory transistor. Under the influence of applied high voltages, a memory cell is programmed by Fowler-Nordheim tunneling of electrons through the thin oxide layer between the drain and floating gate of the memory transistor. Fowler-Nordheim tunneling, also referred to as cold-electron tunneling, is a quantum-mechanical effect that allows electrons to pass through an energy barrier at a silicon-silicon dioxide interface at lower energy levels than hot-electron tunneling.

Referring to FIGS. 10A and 10B, a double-polysilicon EEPROM cell is illustrated. Single-polysilicon and triple-polysilicon EEPROM cells have also been implemented with varying memory cells structures. A word line 10, in combination with doped regions 12 and 14 and a gate oxide layer 11, form an access transistor 20 (as illustrated in the equivalent circuit diagram of FIG. 10B) that is an enhancement-type n-channel metal silicon oxide field effect transistor (MOSFET). The doped region 12 is coupled to a bit line, which in turn is coupled to sensing circuitry that senses the state of the memory cell during a read cycle. A control gate 22 is stacked and separated by an insulating layer 24 above a floating gate 26 of a memory transistor 40. The control gate 22 and floating gate 26 are capacitively coupled by a coupling capacitor $C_C$ formed by electrodes 22, 26 and dielectric layer 24.

The floating gate 26 includes a protruding portion 28 at its bottom surface, which is separated from the doped region 14 by a thin oxide layer 30, which forms the dielectric layer of a thin oxide capacitor $C_T$. The remaining oxide layer 32 surrounding the thin oxide layer 30 formed between the floating gate 26 and the substrate 34 provides the dielectric layer of a capacitor $C_{BG}$. The combination of $C_T$ and $C_{BG}$ provides the gate capacitance of the transistor 40. As illustrated in FIG. 10B, the control gate 22 is coupled to the source of a transistor 50 (also an enhancement-type n-channel MOSFET) having a drain coupled to an ERASE line and a gate coupled to the word line 10.

To program the memory cell, the word line is driven to an elevated voltage Vpp, which may be around 16 volts, for example. The bit line 12 is also coupled to the elevated voltage Vpp, which drives the doped region 14 to a voltage that is Vpp less a threshold voltage (Vt) with body effect of the enhancement-type transistor 20 (e.g., less than around 14 V). The ERASE line is coupled to a ground voltage, which causes the control gate 22 to also be grounded. Due to the induced electric field between the doped region 14 and the control gate 22, electrons tunnel from the floating gate 26 through the thin oxide layer 30 to the doped region 14, leaving the floating gate relatively more positively charged. This shifts the threshold voltage of the memory transistor 40 in the negative direction so that during a read mode the transistor is in the on state or the logical "0" state.

In an erase operation of the illustrated conventional EEPROM cell, the word line 10 is also driven to Vpp while the bit line 12 is driven to ground. The ERASE line is set to Vpp, which drives the control gate 22 to a voltage that is Vpp less a threshold voltage (Vt) of the enhancement-type MOSFET 50. The low-to-high transition of the control gate 22 is capacitively coupled through the coupling capacitor Cc to the floating gate 26. The gate capacitance of the memory transistor 40, including $C_{BG}$, counteracts this capacitively coupling to some degree, which may require a higher Vpp level to adequately capacitively couple the floating gate to an elevated level for erasing. Because the drain 14 of the storage transistor 40 is driven to ground through the transistor 20, the induced electric field between the floating gate 26 and doped region 14 causes electrons to tunnel to the floating gate 26 from the doped region 14. The threshold voltage of the memory transistor 40 shifts in the positive direction so that during a read the transistor is in the off or logical "1" state.

To read the device, the word line 10 is driven to a normal high voltage (Vcc) and the erase line may be driven to about 2 volts or more. The state of the memory cell is determined by sensing current through the transistor 20 and the bit line.

In conventional EEPROMs, the voltage level of Vpp used to program and erase memory cells is typically maintained at a relatively high level to overcome (1) threshold voltage drops associated with enhancement-type MOSFETs coupled to control access to bit lines and erase lines; and (2) the capacitively coupling effect of the memory transistor's gate capacitance counteracting the capacitively coupling of the control gate to the floating gate. The elevated voltage levels of around 16 volts, for example, may give rise to reliability issues in addition to increasing power consumption in such devices. Further, the memory cell structures of conventional EEPROMs may not be efficient for embedded applications due to manufacturing complexities and density requirements.

SUMMARY

In general, according to one embodiment, a semiconductor memory device includes a conductive line that may be coupled to an erase voltage, a common line, and a first transistor coupled between the conductive line and the common line. A memory transistor has a floating gate capacitively coupled to the common line and a source electrically coupled to the common line.

Other features will become apparent from the following description and from the claims.

DETAILED DESCRIPTION

According to embodiments of the invention, memory cells used in electrically erasable and programmable read-only memory (EEPROM) devices may have one or more, or some combination, of the features listed below. The EEPROM devices may be operable with a program and erase voltage (Vpp) that is lower than that of conventional EEPROM devices. Such EEPROM devices may include depletion-type metal oxide silicon field effect transistors (MOSFETs) in the memory array to avoid threshold voltage (Vt) drops associated with enhancement-type MOSFETs. The full Vpp level may be passed through these depletion-type MOSFETs during program and erase operations so that a lower Vpp level may be used. To reduce memory cell layout size, the control gate and source of a memory transistor in each memory cell may be tied to the same physical line. Using the memory structure according to one embodiment, the gate capacitance of the memory transistor helps, rather than hinders as in conventional EEPROM devices, the generation of a high field potential needed for electron tunneling during erase and program operations. Further, the memory cells may have a single-polysilicon memory cell structure in some embodiments. Single-polysilicon memory cells may be advantageous for embedded applications in which the EEPROM forms a part of an overall device such as a microcontroller, an application specific integrated circuit (ASIC) device, a field programmable gate array (FPGA) device, or other electronic devices.

Implementation of one or more of the listed features may provide some advantages, including improved reliability and reduced power consumption due to reduced Vpp levels, improved layout density, simplified manufacturing process, and simplified peripheral circuit design.

In this description, the term EEPROM includes devices that are byte-erasable and programmable, as well as flash memory devices, in which memory cells may be erased in bulk (the entire memory array), by sectors in the array, by pages (e.g., one row), or by some other defined portion of the array. In the ensuing description, although reference is made to specific memory structures in memory devices, it is contemplated that embodiments of the invention may be implemented in any of a number of different memory architectures or configurations. Also, in this description, reference is made to the drains and sources of transistors—it is contemplated that the drain and source of a transistor is interchangeable and thus connections of the drains and sources of a transistor to particular nodes may be switched.

Figure 1:
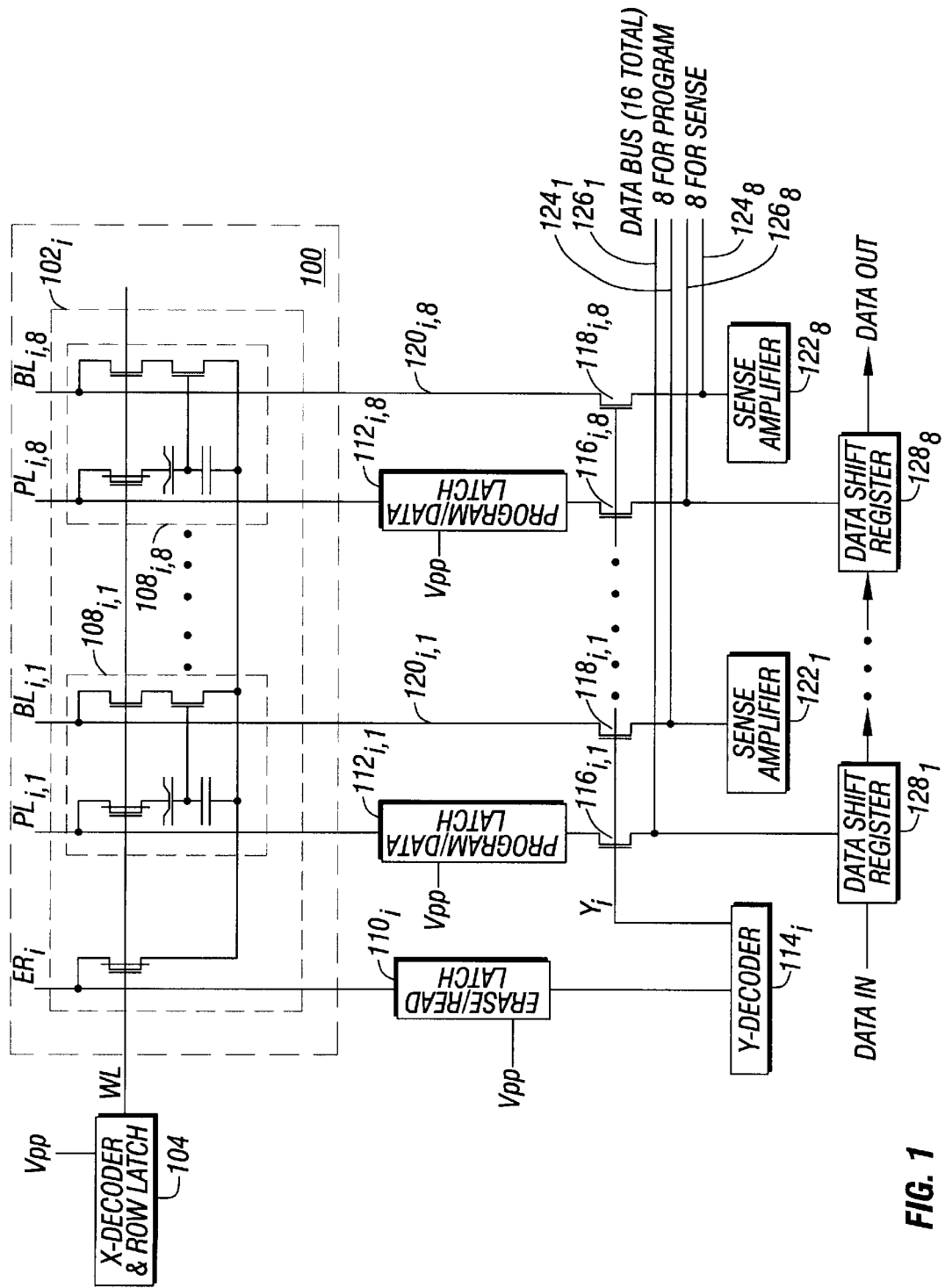
FIG. 1 is a diagram of components in an electrically erasable and programmable read-only memory (EEPROM) in an embodiment of the invention.

Referring to FIG. 1, an EEPROM device (which is illustrated as a serial EEPROM) includes a memory array 100 having multiple rows controllable by corresponding word lines WL. It is to be understood that other types of EEPROMs may be implemented with embodiments of the invention. The memory array 100 in one embodiment includes multiple blocks of memory cells, with one block $102_i$ (i ranging between 1 and a value n representing the total number of blocks in a row) shown in FIG. 1. In one embodiment, a block $102_i$ may include 8 memory cells (one byte), although other configurations are also possible. Each memory block $102_i$ may include 8 memory cells $108_{i,1}$–$108_{i,8}$ and is associated with an erase line $ER_i$. Each memory cell $108_{i,j}$, j=1–8, is associated with a corresponding program line $PL_{i,j}$ and bit line $BL_{i,j}$. Each row of memory cells 108 is selected by a corresponding word line from a row decoder 104. Each erase line $ER_i$ is controlled by an erase/read latch $110_i$, and each program line $PL_{i,j}$ is controlled by a corresponding program/data latch $112_{i,j}$. The blocks 102 of memory cells in a row are coupled by common data lines $124_1$–$124_8$ to a set of sense amplifiers $122_1$–$122_8$ and by common data lines $126_1$–$126_8$ to a set of data shift registers $128_1$–$128_8$.

One of multiple column decoders $114_i$ controls loading of the erase/read latch $110_i$ and the set of program/data latches $112_1$–$112_8$. The column decoder $114_i$ provides a column select signal $Y_i$ that controls the gates of access transistors $116_{i,1}$–$116_{i,8}$ and $118_{i,1}$–$118_{i,8}$. The access transistors $118_{i,1}$–$118_{i,8}$ are coupled between bit lines $120_{i,1}$–$120_{i,8}$ and corresponding data lines $124_1$–$124_8$. The access transistors $116_{i,1}$–$116_{i,8}$ are coupled between the program/data latches $112_{i,1}$–$112_{i,8}$ and data lines $1261_1$–$126_8$.

To program selected blocks of memory cells, program bits are serially shifted into the shift registers $128_1$–$128_8$ and loaded into the program/data latches $112_{i,1}$–$112_{i,8}$ corresponding to the selected memory blocks $120_i$. To erase selected blocks, the erase/read latches $110_i$ of the selected blocks $120_i$ are loaded.

During a read operation, the sense amplifiers $122_{1-8}$ are coupled to sense current on corresponding bit lines $120_{i,1-8}$ of a selected block $102_i$. The outputs of the sense amplifiers $122_{1-8}$ are provided to corresponding data shift registers $1281_{1-8}$. Data from the data shift register bits $128_{1-8}$ are shifted onto a data out line.

Figure 2:
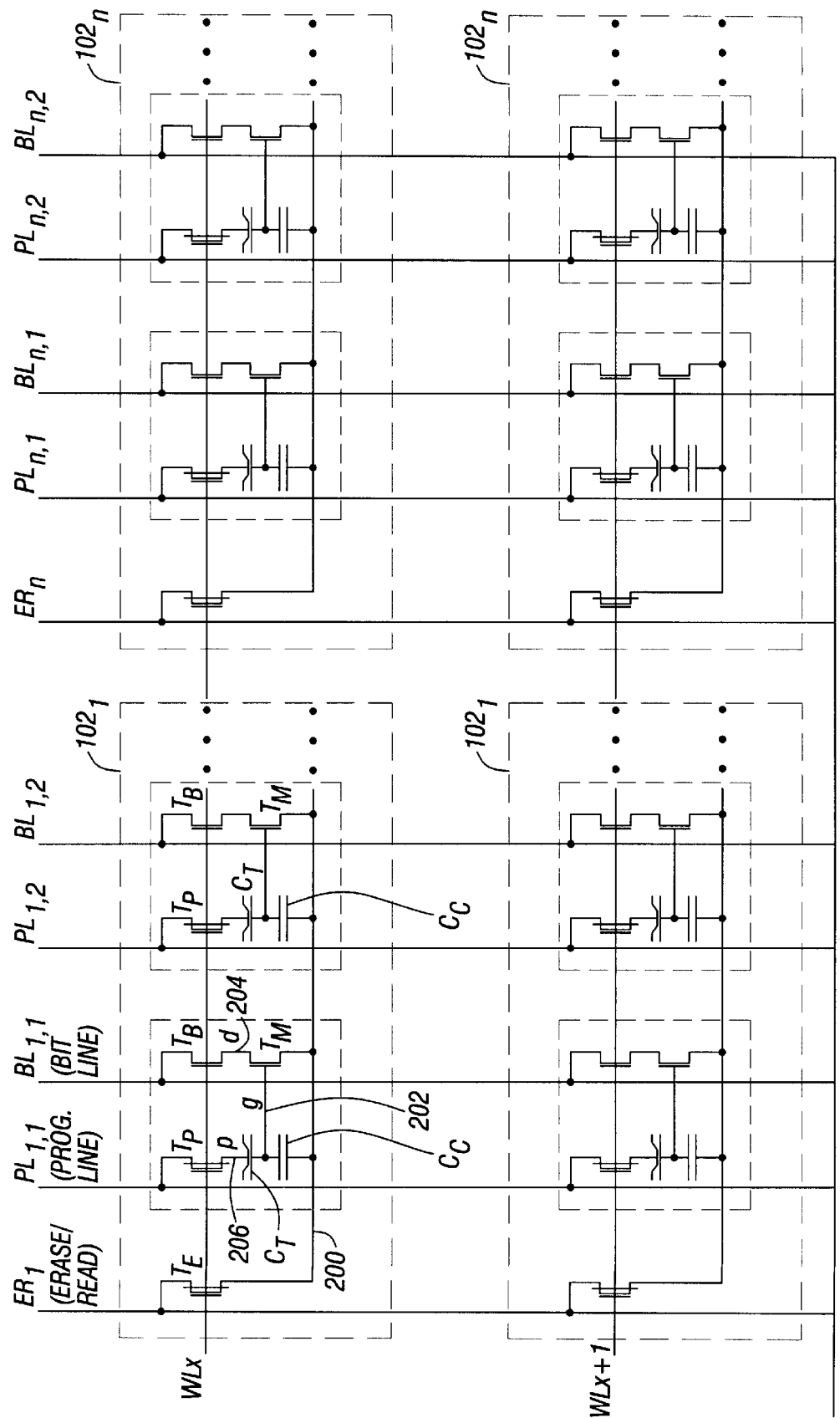
FIG. 2 is a schematic diagram of portions of a memory array according to an embodiment in the EEPROM of FIG. 1.

Referring to FIG. 2, a schematic circuit diagram of several blocks of memory cells in the memory array 100 according to one embodiment are illustrated, including memory blocks $102_i$, $102_n$ in two rows selected by $WL_x$ and $WL_{x+1}$. As illustrated, n memory blocks $102_i$ to $102_n$ are located in the row controlled by the word line $WL_x$, and n other memory blocks are located in the row controlled by $WL_{x+1}$. Across a row, each memory block $102_i$ is associated with one erase line $ER_i$, i=1–n. The memory cells $108_{i,1-8}$ in a particular memory block $102_i$ are coupled to corresponding program lines $PL_{i,1-8}$ and bit lines $BL_{i,1-8}$. According to some embodiments, use of separate program line $PL_{i,j}$ for each memory cell $108_{i,j}$ allows a depletion-type MOSFET to be coupled to transfer the program voltage Vpp to the memory cell in some program operations. Use of a depletion-type MOSFET avoids the Vt loss associated with enhancement-type transistors as implemented in memory cells of conventional EEPROMs.

In addition, use of an extra line for the program line separates the read and program paths, which simplifies peripheral circuit design and layout in the EEPROM. Further, because of the simplified peripheral circuitry, die area needed for the EEPROM may be reduced, which is advantageous for EEPROMs used for embedded applications. For example, the EEPROM may be a low density serial EEPROM that may occupy less than about 20% of the total die area of an overall device.

As illustrated in FIG. 2, in each memory cell $108_{i,j}$, a program line $PL_{i,j}$ is coupled to the drain of a depletion-type n-channel MOSFET $T_P$ having a gate coupled to a word line WL. Further, in each memory block $102_i$, the erase line $ER_i$ is coupled to a depletion-type n-channel MOSFET $T_E$ having its gate coupled to the word line WL. Again, the depletion-type transistor $T_E$ allows the full voltage level (Vpp in erase operations) on the line $ER_i$ to be passed through the transistor $T_E$ to a common line 200 that is coupled to all the memory cells $108_{i,1-8}$ in the memory block $102_j$.

In one embodiment, the threshold voltage of the depletion-type transistors $T_E$ and $T_P$ may be around $-2$ V. Thus, by using depletion-type MOSFETs couple to both the ER and PL lines, the erase and program voltage Vpp may be set at a lower level, which in one embodiment may be around 3 to 4 volts less than the Vpp levels in conventional EEPROMs. By having lower Vpp levels, less stringent design and process rules may be implemented to simplify device fabrication.

In each memory cell $108_{i,j}$, the source of the depletion-type transistor $T_P$ is coupled to one side of a thin oxide or tunneling capacitor $C_T$. The other side of the capacitor $C_T$ is coupled to the floating gate 202 of an enhancement-type n-channel MOSFET $T_M$ (the memory transistor). A coupling capacitor $C_C$ is capacitively coupled between the floating gate 202 and the common line 200. In the illustrated embodiment, the common line 200 is both electrically coupled to the source of the memory transistor $T_M$ and capacitively coupled to the control gate for the transistor $T_M$ (through the coupling capacitor $C_C$). Thus, effectively, the common line 200 forms both the common source line and the control gate of the memory transistor $T_M$, which is different from conventional EEPROM devices in which separate lines are typically used. One advantage this may offer is space savings in the layout of the memory cells.

Further, according to some embodiments, a single-polysilicon process may be used to implement the EEPROM cells. In one embodiment, the word lines WL and floating gates of the memory transistors $T_M$ may be implemented in the same polysilicon level. A single-polysilicon process may be advantageous for embedded applications in which single-polysilicon technologies are typically used.

The drain of the memory transistor $T_M$ is coupled to the source of an enhancement-type n-channel MOSFET $T_B$ (access transistor) that has a gate coupled to a word line WL and a drain coupled to a bit line $BL_{i,j}$. The other memory cells $108_{i,j}$ in the entire memory array 100 are similarly constituted Operation of the device is described below. The voltage levels of the $ER_i$, $PL_{i,j}$, and $BL_{i,j}$ lines for a memory cell $108_{i,j}$ in a memory block $102_i$ during a program, erase, and read operation are shown in Table 1 below.

TABLE 1

|  | WL | $ER_i$ | $PL_{1,1}$ | $BL_{i,j}$ |
| --- | --- | --- | --- | --- |
| ERASE | Vpp | Vpp | 0 | Float or Vpp |
| PROGRAM | Vpp | 0 | 0 or Vpp | 0 |
| READ | Vcc | 0 | 0 | Read Bias |

Each memory cell $108_{i,j}$ may be individually programmed to the on or "0" state or to the off or "1" state. In an erase operation, all bits in a memory block are erased at one time to the off or "1" state. As indicated in Table 1, to erase a memory cell $108_{i,j}$ in a memory block $102_i$ according to one embodiment, the word line WL is raised to the voltage Vpp, the erase line $ER_i$ is raised to Vpp, the program line $PL_{i,j}$ is set at zero volts, and the bit line $BL_{i,j}$ is left either floating or set at Vpp. The transistor $T_E$ passes the full Vpp voltage from the $ER_i$ line through the depletion-type transistor $T_E$ to the common line 200. As shown in a timing diagram of FIG. 3, the line ERi is transitioned to Vpp at time T1. The low-to-high voltage transition is capacitively coupled through the coupling capacitor $C_C$ to the floating gate 202, as the coupling capacitor $C_C$ has a much higher capacitance then the capacitor $C_T$. The low-to-high transition on the floating gate 202 turns on the memory transistor $T_M$. As a result, the high voltage on the line 200 is passed through the memory transistor $T_M$ to charge up the drain of the transistor $T_M$ (indicated as 204). If the bit line $BL_{i,j}$ was initially floating at a low voltage, the common line 200 may charge up the bit line $BL_{i,j}$ through the transistors $T_M$ and $T_B$. The low-to-high transition of the bit line $BL_{i,j}$ occurs at time T2 (FIG. 3).

Figure 10A:
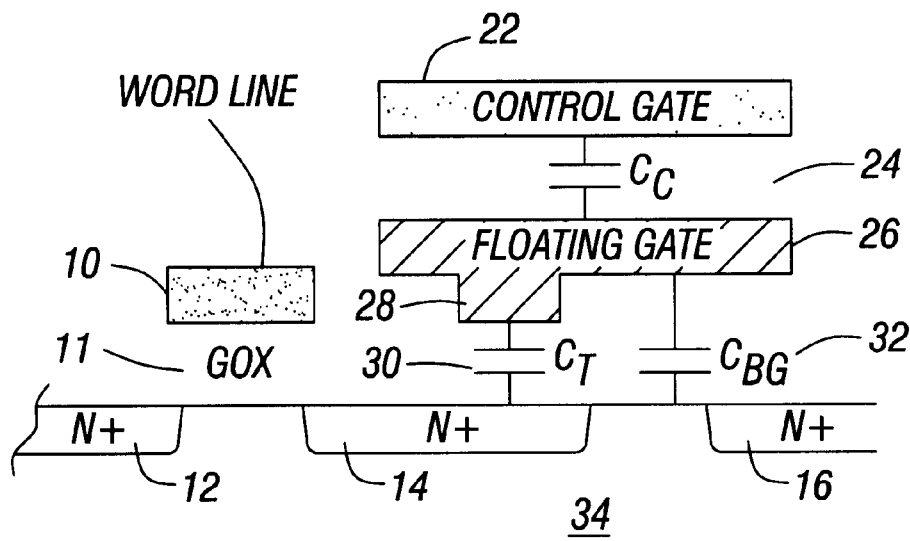
FIGS. 10A and 10B are diagrams of structures in a conventional EEPROM array.
Figure 10B:
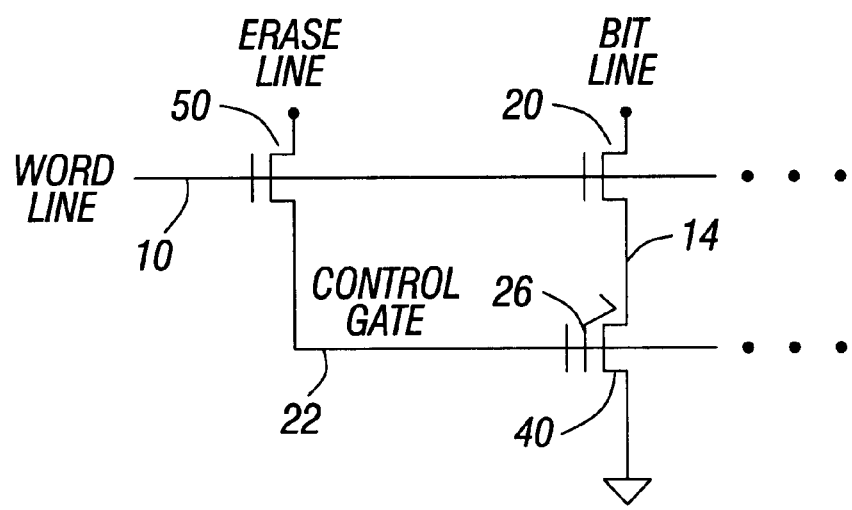

The gate capacitance $C_G$ of the memory transistor $T_M$ has a self-boosting effect that helps the floating gate 202 reach a higher voltage level. The low-tohigh transition of the drain, source, and channel region of the memory transistor $T_M$ is coupled to the floating gate 202 by the gate capacitance $C_G$ to a higher voltage than just from coupling by the capacitor $C_C$ of the common line 200 voltage onto the floating node 202. In contrast, in conventional EEPROM memory cells, the gate capacitance $C_{BG}$ of the memory transistor normally counters the coupling capacitance between the control gate and the floating gate (as illustrated in FIG. 10A). The electric field established across the thin oxide in the capacitor $C_T$ resulting from the voltage difference between the floating gate 202 and the zero volts at the source of the transistor $T_P$ (because the program line $PL_{i,j}$ is held at zero volts) causes electrons to flow to the floating gate 202 from the source of the transistor $T_P$. As a result, the floating gate transistor $T_M$ is placed in the offstate.

Figure 3:
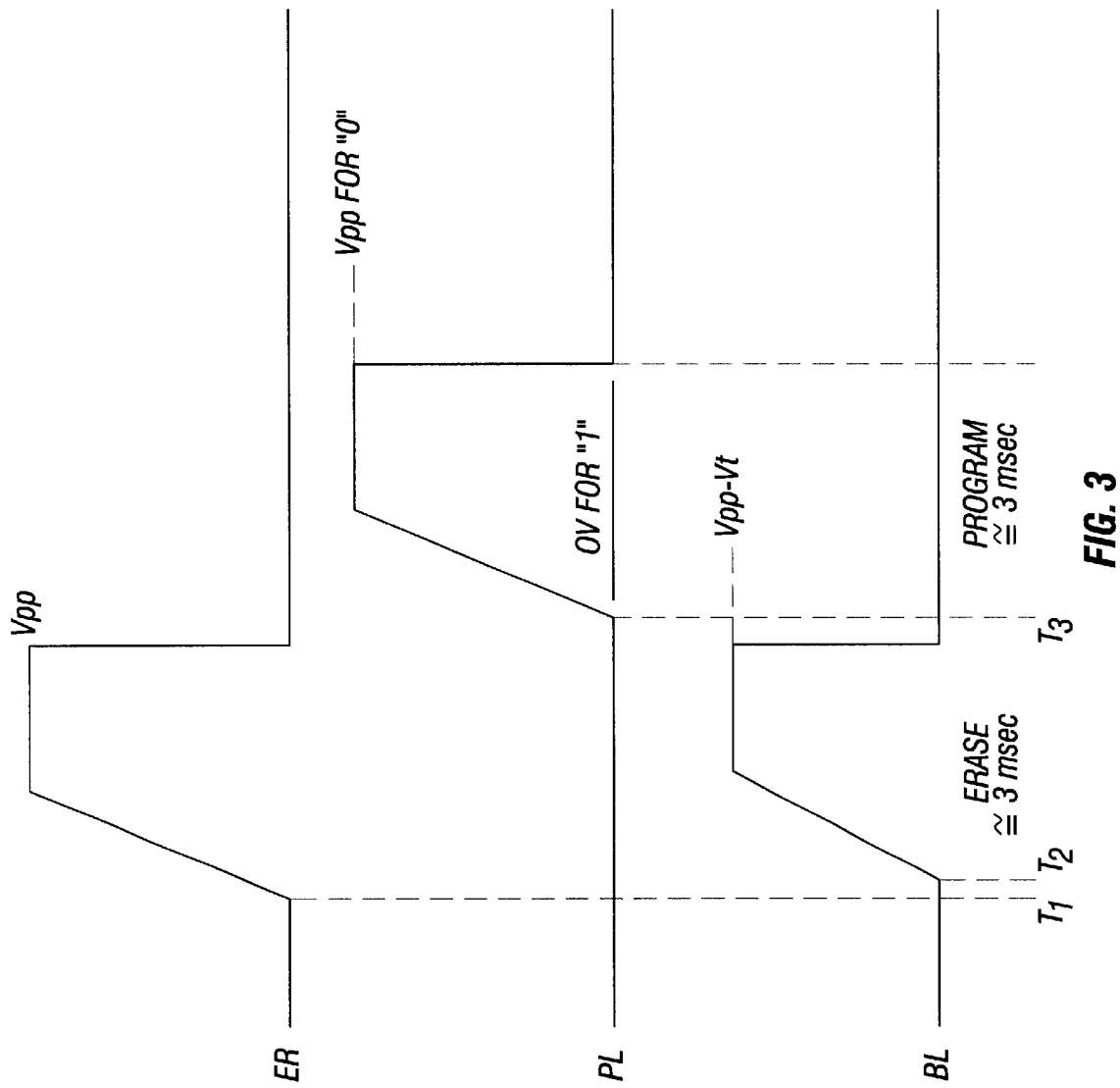
FIG. 3 is a timing diagram of signals in erase and program operations in the EEPROM of FIG. 1.

In the illustrated embodiment that operates according to FIG. 3, an erase operation may take from about 0.5 to 3 milliseconds (ms), for example.

To program a memory cell $108_{i,j}$ in a memory block $102_i$, the word line WL is raised to Vpp, the erase line $ER_i$ is set at zero volts, the program line $PL_{i,j}$ is raised to Vpp (to program a "0" or on state) or set at zero volts (to maintain a "1" or off state), and the bit line $BL_{i,j}$ is set at zero volts. In FIG. 3, the program line $PL_{i,j}$ is driven to Vpp at time T3 to program a "0" (or it is driven to zero volts to maintain a "1").

A Vpp level at the program line $PL_{i,j}$ is passed through the depletion-type transistor $T_P$ to its source (node 206). When the electric field established between the thin oxide forming the capacitor $C_T$ reaches the level for tunneling, electrons flow away from the floating gate 202 to the source of the transistor $T_P$, which results in net holes in the floating gate 202 to provide an on or "0" state. If the programming line $PL_{i,j}$ is kept at zero volts, the memory transistor is kept in the off state. As illustrated in FIG. 3, the programming operation may take from about 0.5 to 3 ms, for example.

To erase or program the memory cells, a page mode operation may also be available. Instead of only one block $102_i$ being selected for erasing or programming, more than one block along the same word line may be selected for activation. This is controlled by the program/data latches $112_{i,1-8}$ and the erase/read latches $110_i$.

For a read operation of a selected memory block $102_i$, the bank of sense amplifiers $122_{1-8}$ (FIG. 1) are coupled to the bit lines $BL_{i,1-8}$ through transistors $118_{i,1-8}$. A word line WL is raised to Vcc, and the erase line $ER_i$ and program line $PL_{ij}$ are kept at zero volts. The electrical path through the bit lines $BL_{i,1-8}$ and corresponding transistors $T_B$, $T_M$, and $T_E$ determine whether the memory transistor $T_M$ is in the on or off state. During a read operation, the $ER_i$ line also serves as a conventional control gate for the memory cell. As it also serves as the source of the memory transistor $T_M$, the control gate 200 is set at zero volts.

After an erase operation, the threshold voltage $Vt_{erased}$ of the memory transistor $T_M$ is positive, e.g., around 3 V. However, after a program operation of "0 0," the threshold voltage $Vt_{prog}$ of $T_M$ is negative, e.g., around −3 V. The threshold voltages $Vt_{erased}$ and $Vt_{prog}$ of the transistor $T_M$ may be centered somewhere around zero volts. If, however, $Vt_{erased}$ and $Vt_{prog}$ of the transistor $T_M$ are not centered around zero volts, an implant may be performed in the channel under the gate of the transistor $T_M$ to center its $Vt_{erased}$ and $Vt_{prog}$ around zero volts.

Figure 4:
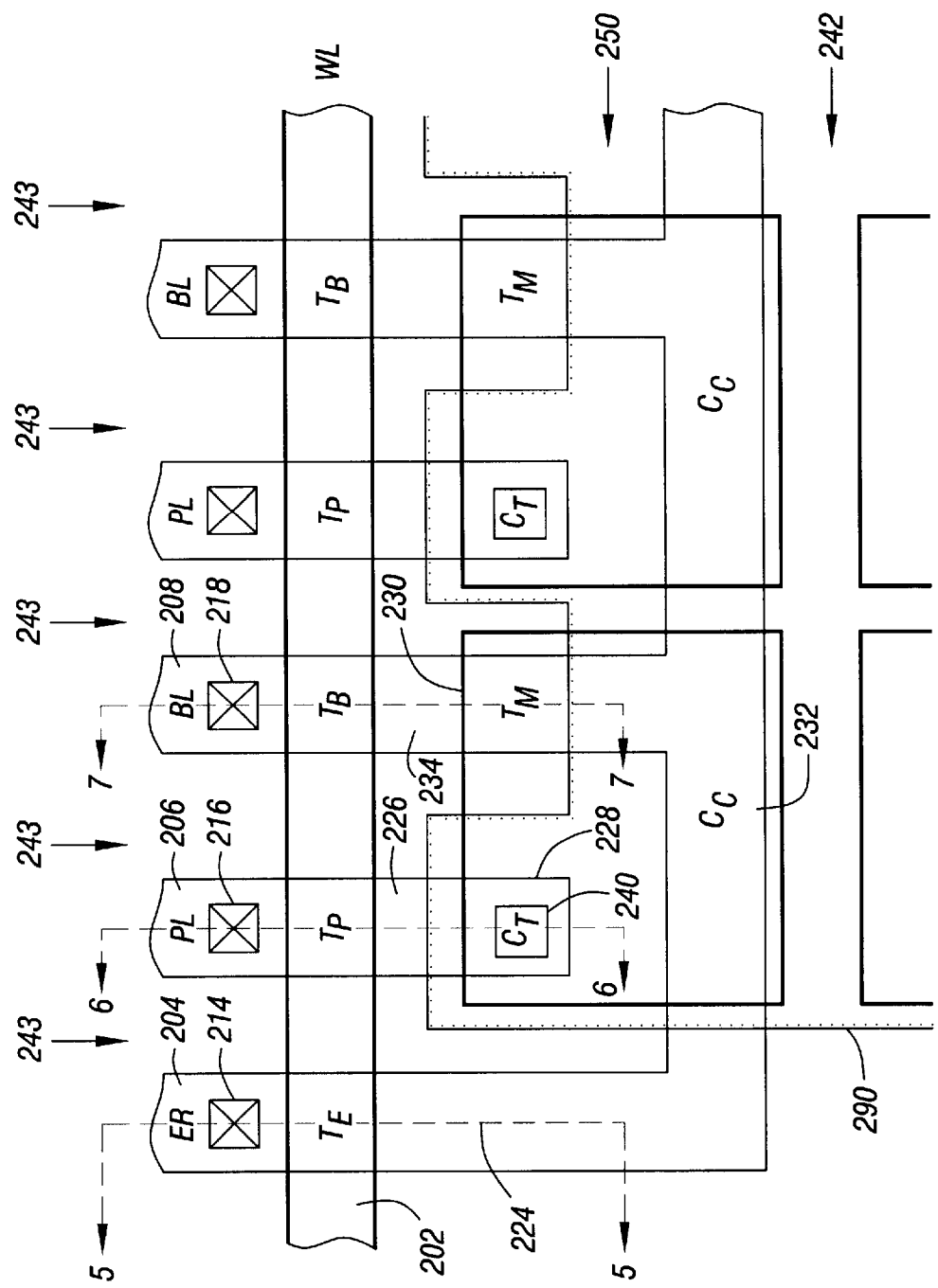
FIG. 4 is a top view layout of memory cells according to an embodiment in the EEPROM of FIG. 1.

Referring to FIG. 4, a top view layout of two adjacent memory cells in a memory block and an associated ER line is illustrated. In the memory structure according to an embodiment, a single-polysilicon process is used, which may simplify the process of fabricating the memory cell over conventional double-polysilicon EEPROM devices. As a result, manufacturing cost may be reduced. A conductive layer 202 including, for example, polysilicon (or a combination of polysilicon and a silicide), that forms a word line WL runs generally horizontally. The polysilicon line 202 forms the gates of transistors $T_E$, $T_P$, and $T_B$. A contact 214 couples an N+ doped region 204 forming the drain of the transistor $T_E$ to an ER line (not shown), which may be formed of metal, for example. A contact 216 electrically couples the PL line to an N+ doped region 206 forming the drain of transistor $T_P$, and a contact 218 electrically couples the BL line to an N+ doped region 208 forming the drain of the transistor $T_B$ in each memory cell.

The source of the transistor $T_E$ is formed in an N+ doped region 224, which extends to electrically couple a buried N+ region 232 that runs to each of the memory cells in a block. The buried N+ region 232 forms the common line 200 coupled to the memory transistors of each cell in a block. For illustrative purposes, a buried N+ mask 290 may be used to define buried N+ regions, including the buried N+ region 232.

An N+ doped region 226 forming the source of the transistor $T_P$ is contacted to another buried N+ region 228, also defined by the illustrative buried N+ mask 290. An N+ doped region 234 forms the common drain and source for the transistors $T_M$ and $T_B$, respectively. The source of the transistor $T_M$ is formed by a section of the buried N+ region 232.

A generally rectangular conductive layer 230, which may also include polysilicon formed of the same polysilicon level as the word lines 202, makes up the floating gate of the transistor $T_M$. The polysilicon layer 230 covers a portion of the buried N+ region 228, a portion of the buried N+ region 232, and the gate area of the memory transistor $T_M$. The electrodes of the coupling capacitor $C_C$ are provided by the polysilicon layer 230 and the buried N+ region 232 where they overlap. The dielectric of the coupling capacitor $C_C$ is formed by an insulating layer (e.g., an oxide layer, a nitride layer, or a combination of the two) between the buried N+ region 232 and the polysilicon layer 230.

A thin oxide layer is formed under a portion 240 of the polysilicon layer 230 to provide the thin oxide capacitor $C_T$.

The electrodes of the capacitor $C_T$ are formed by the floating polysilicon layer 230 and the buried N+ region 228. During program and erase operations, electrons tunnel through the thin oxide layer underneath the polysilicon portion 240.

Isolation regions 250 (e.g., field oxide layers or trenches) may be formed between the sources of the transistors $T_P$ and the buried N+ region 232 that runs generally horizontally and that is coupled to each memory transistor $T_M$ in a block. In addition, isolation regions 243 (which may also be formed of field oxide layers or trenches) may also be formed between adjacent transistors $T_E$, $T_P$, or $T_B$. Another isolation region 242 is formed between different rows of memory cells.

Figure 5:
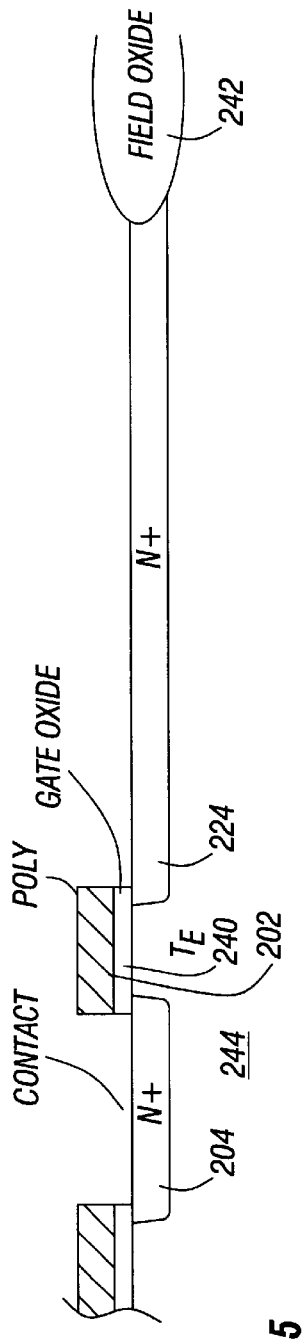
FIGS. 5, 6, and 7 are cross-sectional diagrams of different sections of the EEPROM a memory cell in FIG. 4.
Figure 6:
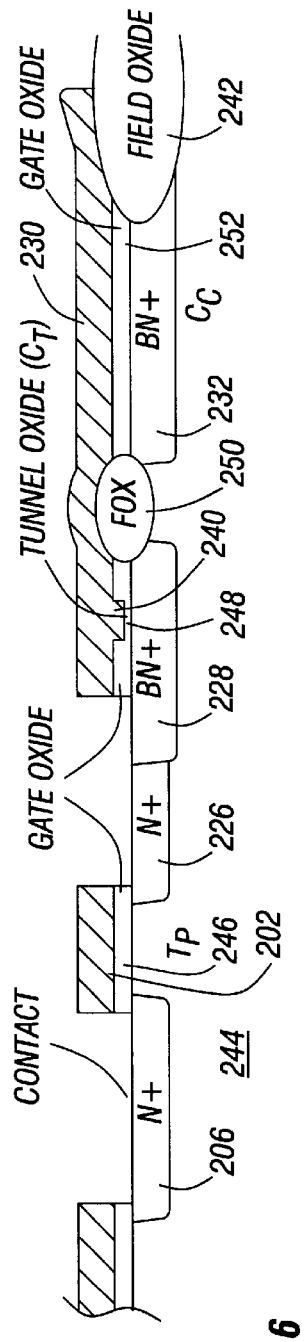
Figure 7:
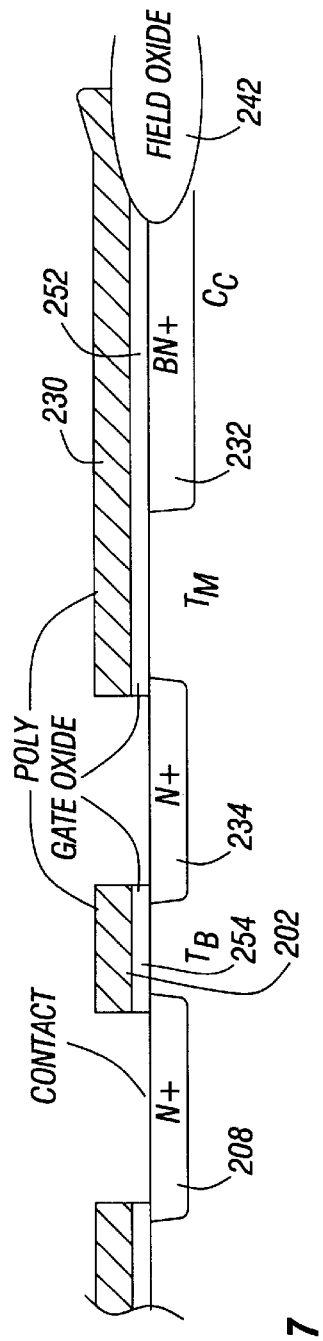

Referring to FIGS. 5, 6, and 7, three cross-sectional views are taken along different sections of the memory cell shown in FIG. 4. FIG. 5 is a section taken along the transistor $T_E$, FIG. 6 is a section taken along transistor $T_P$, and FIG. 7 is a cross-section taken along transistors $T_B$ and $T_M$.

In FIG. 5, the transistor $T_E$ is formed by N+ doped regions 204 and 224 and the polysilicon layer 202 that is coupled to the word line. A gate oxide layer 240 is formed between the substrate 244 and the polysilicon layer 202. The field oxide layer 242 isolates memory cells in one row from the adjacent row.

In FIG. 6, the transistor $T_P$ is formed by N+ doped regions 206 and 226, the polysilicon layer 202, and a gate oxide layer 246 formed between the substrate 244 and the polysilicon layer 202. The buried N+ region 228 is contacted to the doped region 226. The polysilicon portion 240 protruding from under the polysilicon layer 230 allows formation of a thin layer of oxide 248, which forms the dielectric of the capacitor $C_T$. Electron tunneling occurs through the thin oxide layer 248. The threshold voltage Vt of the transistor $T_M$ varies according to whether the polysilicon layer 230 is filled with holes or electrons due to the Fowler-Nordheim electron tunneling effect through the thin oxide capacitor $C_T$. The field oxide layer 250 is formed to isolate the buried N+ region 228 from the buried N+ region 232. A cross-section of the coupling capacitor $C_C$ is shown having an oxide layer 252 between the buried N+ region 232 and the polysilicon layer 230.

In FIG. 7, transistor $T_B$ is formed by N+ doped regions 208 and 234, the polysilicon layer 202, and a gateoxide layer 254. The transistor $T_M$ is formed by the doped region 234, the buried N+ region 232, the floating gate polysilicon layer 230, and a gate oxide layer 252. FIG. 7 also depicts a cross-section of the coupling capacitor $C_C$, including layers 230, 252, and 232.

Figure 8:
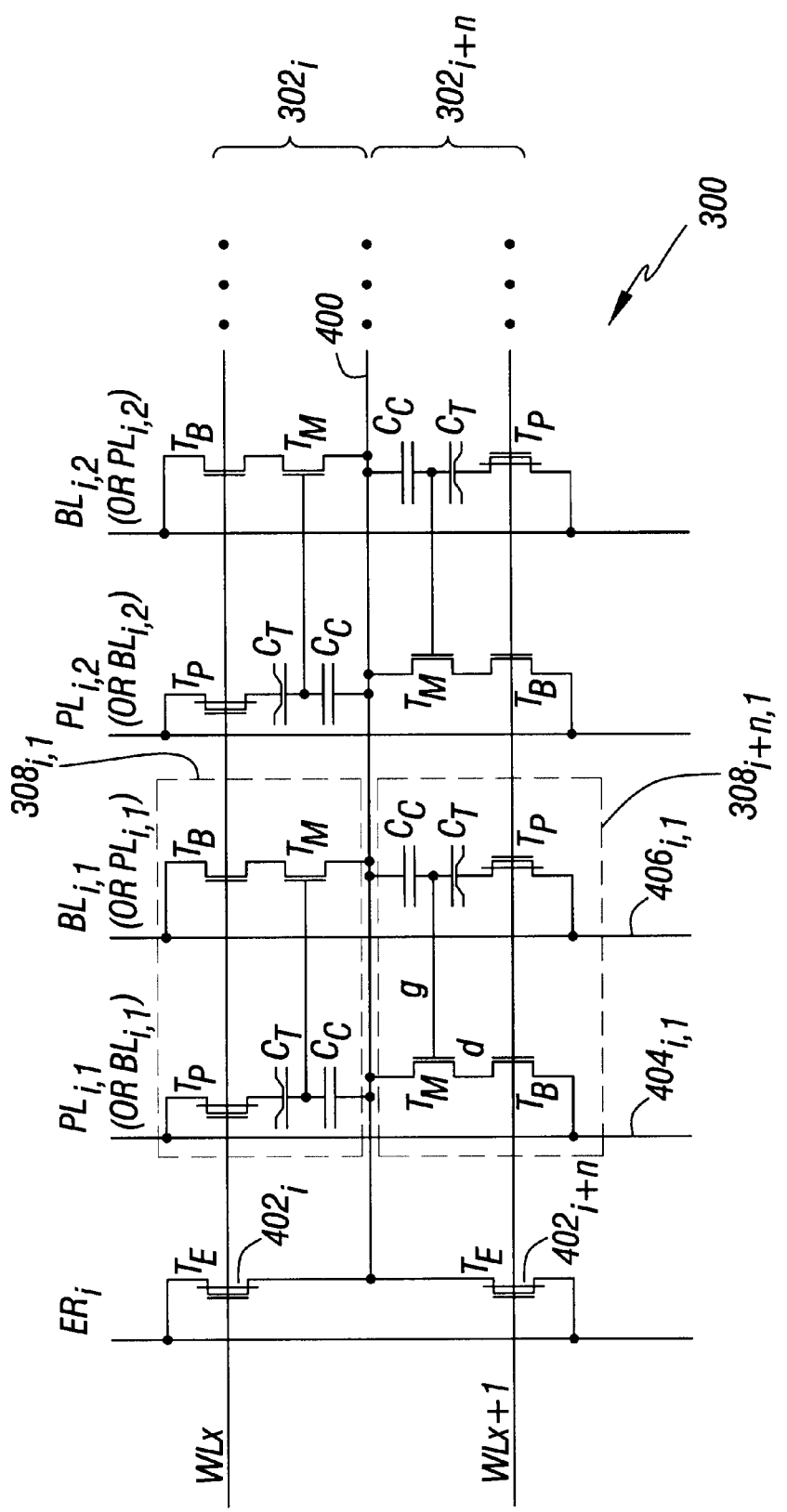
FIG. 8 is a schematic diagram of portions of an EEPROM array according to another embodiment of the invention.

Referring to FIG. 8, a portion of an EEPROM array 300 according to another embodiment of the invention is illustrated. In this embodiment, two adjacent rows of memory cells share a common line 400. In FIG. 8, two memory blocks $302_i$ and $302_{i+n}$ in two different rows (first row controlled by word line $WL_x$ and the next row controlled by word line $WL_{x+1}$). There are n blocks of memory cells in each row.

The first memory block $302_i$ includes a depletion-type MOSFET $402_i$ and the second block $302_{i+n}$ includes a depletion-type MOSFET $402_{i+n}$. The drain of the transistor $402_i$ and the source of the transistor $402_{i+n}$ are coupled to the erase line $ER_i$. The source of the transistor $402_i$ and the drain of the transistor $402_{i+n}$ are both coupled to the common line 400, which in turn is coupled to all memory cells $308_{ij}$ and $308_{i+n,j}$ in blocks $302_i$ and $302_{i+n}$. The gates of the transistors $402_i$ and $402_{i+n}$ are coupled to word lines $WL_x$ and $WL_{x+1}$, respectively.

Any two memory cells $308_{i,j}$ and $308_{i+n,j}$ share a pair of lines $404_{i,j}$ and $406_{i,j}$. For a memory cell $308_{i,j}$, the line $404_{i,j}$ constitutes the program line $PL_{i,j}$ while the line $406_{i,j}$ constitutes the bit line $BL_{i,j}$. For a memory cell $308_{i+n,j}$ in the next row, however, the line $404_{i,j}$ constitutes the bit line $BL_{i,j}$ and the line $406_{i,j}$ constitutes the program line $PL_{i,j}$. Thus, the lines 404 and 406 alternate between program lines PL and BL depending on which of the rows is selected.

Each memory cell $308_{i,j}$ in the memory block $302_i$ includes a depletion-type MOSFET $T_p$, a thin oxide capacitor $C_T$, a coupling capacitor $C_C$, a memory transistor $T_M$, and an access transistor $T_B$ coupled in the same way as corresponding elements in each memory cell $108_{i,j}$ in the embodiment of FIG. 2. In each memory cell $308_{i,j}$, the drain of the transistor $T_P$ is coupled to the line $404_{i,j}$, and the drain of the transistor $T_B$ is coupled to the line $406_{i,j}$. One side of the coupling capacitor $C_C$ and the source of the memory transistor $T_M$ are coupled to the common line 400.

For each memory cell $308_{i+n,j}$ in the next block $302_{i+n}$, the components $T_P$, $C_T$, $C_C$, $C_M$, and $T_B$ are similarly coupled except that the drain of the transistor $T_P$ in the memory cell $308_{i+n,j}$ is coupled to the line $406_{i,j}$ and the drain of the transistor $T_B$ is coupled to the line $404_{i,j}$. This is the reverse coupling of the transistors $T_B$ and $T_P$ in the memory cell $308_{i,j}$. The source of the memory transistor $T_M$ and the coupling capacitor $C_C$ are also coupled to the common line 400.

The electrical operations (including erase, programming, and read operations) of memory cells $308_{i,j}$ and $308_{i+n,j}$ in the memory blocks $302_i$ and $302_{i+n}$ are summarized in Table 2 below.

TABLE 2

|  | $WL_x$ | $WL_{x+1}$ | ER | $404_{i,j}$ | $406_{i,j}$ |
|---|---|---|---|---|---|
| Erase Block 302 | Vpp | 0 | Vpp | 0 | Precharge Voltage |
| Erase Block $302_{i+n}$ | 0 Voltage | Vpp | Vpp | Precharge | 0 |
| Program Block 302 | Vpp | 0 | 0 | Vpp or 0 | 0 |
| Program Block $302_{i+n}$ | 0 | Vpp | 0 | 0 | Vpp or 0 |
| ReadBlock $302_i$ | Vcc | 0 | 0 | 0 | Read Bias |
| Read Block $302_{i+n}$ | 0 | Vcc | 0 | Read | 0 Bias |

To erase the upper block $302_i$, the word line $WL_x$ is raised to Vpp while the next word line $WL_{x+1}$ is kept at zero volts. The erase line $ER_i$ is raised also to Vpp, while the line $404_{i,j}$ (which constitutes the program line for the block $302_i$) is maintained at zero volts. The line $406_{i,j}$ (which constitutes the bit line for the block $302_i$) is driven to a precharge voltage to ensure that the depletion-type transistor $T_P$ in each of the memory cells $308_{i+n}$ are maintained off so that the memory cells in the adjacent, lower block are not inadvertently erased. Right before the erase operation, the line $406_{i,j}$ is left floating at the precharge voltage. The precharge voltage may be set at a sufficiently negative voltage to maintain the transistor $T_P$ (which in one embodiment may have a threshold voltage Vt of approximately −2 volts). When one block, such as the block $302_i$, is being erased, the ER line is driven to Vpp, which is passed to the common line 400. The rise of the common line 400 is coupled by the coupling capacitor $C_C$ in each of the memory cells $308_{i,j}$ (which are to be erased) as well as through the coupling capacitor $C_C$ in each of the memory cells $308_{i+n,j}$ in the adjacent block (which are not to be erased). In the lower block $302_{i+n}$, however, since the transistors $T_P$ in each memory cell $308_{i+n,j}$ are off, the voltage coupled onto the floating gate of the memory transistor $T_M$ is also coupled onto the source of each transistor $T_P$. As a result, no high electric field is established across the thin oxide capacitor $C_T$ to cause electron tunneling in the memory cells that are not to be erased.

However, some leakage current does occur due to junctions coupled to the source of the transistor $T_P$ in the memory cells of the memory block that are not to be erased. As a result, the source of each transistor $T_P$ in the memory cells will decay with time. Thus, the erase operation is completed within a predetermined period of time, e.g., between around 0.5–3 ms, to avoid creation of the high field potential that may cause electron tunneling.

If the portion of the memory array 300 illustrated in FIG. 8 is implemented in a flash device that is bulk erased or sector erased, the precharge of one of the lines $404_{i,j}$ or $406_{i,j}$ as described above for the block-erase device may not be needed since the adjacent blocks $302_i$ and $302_{i+n}$ may be both erased. The two blocks $302_i$ and $302_{i+n}$ are erased in two separate erase cycles since they are in two separate rows.

As further shown in Table 2, to erase the lower block $302_{i+n}$, the word line $WL_x$ is kept low while the word line $WL_{x+1}$ is raised to Vpp. The erase line $ER_i$ is also raised to Vpp. The line $404_{i,j}$ (which constitutes the bit line $BL_{i,j}$ of the memory block $302_{i+n}$) is set at the precharge voltage while the line $406_{i,j}$ (which constitutes the program line $PL_{i,j}$ of the memory block $302_{i+n}$) is set at zero volts.

To program the block $302_i$ or $302_{i+n}$, one of the word lines $WL_x$ or $WL_{x+1}$ is raised to Vpp. The erase line $ER_i$ is set at 0 volts. To program upper memory block $302_i$, the line $404_{i,j}$ is set at Vpp or zero volts (to program a "0" or a "1" state, respectively) while the line $406_{i,j}$ is set at zero volts. To program the lower block $302_{i+n}$, the line $406_{i,j}$ is set at Vpp or zero volts while the line $404_{i,j}$ is set at zero volts.

To read the block $302_i$ or $302_{i+n}$, one of the word lines $WL_x$ and $WL_{x+1}$ is raised to Vcc. The erase line $ER_i$ is set at zero volts. From the upper memory block $302_i$, the state of the memory cell is read on line $406_{i,j}$, while for lower memory block $302_{i+n}$, the state of the memory cell is read on line $404_{i,j}$.

Figure 9:
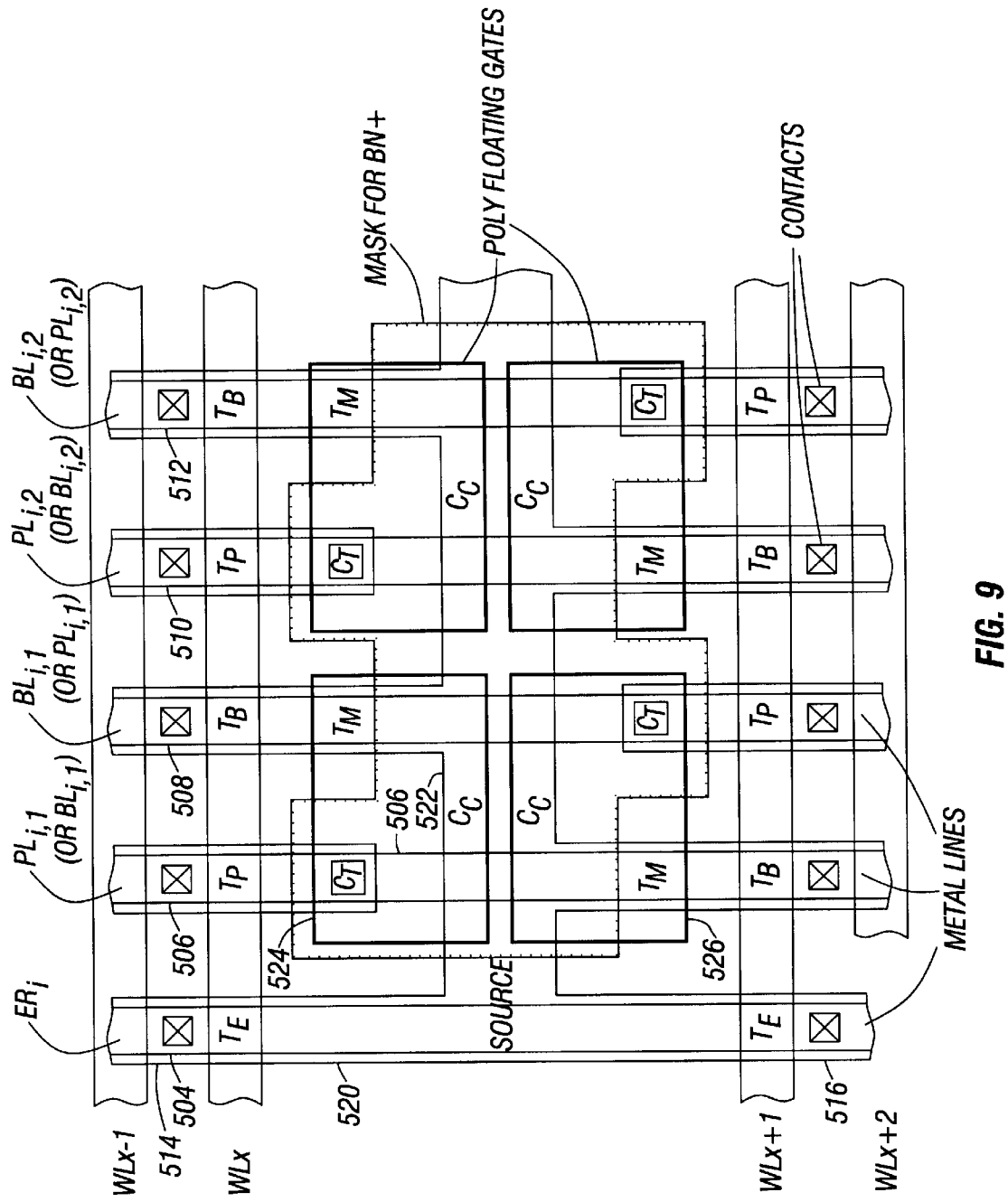
FIG. 9 is a top view layout of memory cells according to another embodiment in the EEPROM array of FIG. 8.

Referring to FIG. 9, the top view layout of a portion of the memory array 300 according to the embodiment of FIG. 8 is illustrated. Four layers including polysilicon (or alternatively polysilicon and a silicide) running generally horizontally form word lines $WL_{x-1}$, $WL_x$, $WL_{x+1}$, and $WL_{x+2}$. Conductive lines (which may be metal lines, for example) 504, 506, 508, 510 and 512 form the ER, PL, and BL lines coupled to memory cells 308 in the memory array. The ER line 504 is coupled to an N+ doped region 514 of the transistor $T_E$ in the top memory block $302_i$ and to an N+ doped region 516 in the bottom memory block $302_{i+n}$. The source of the top transistor $T_E$ and the drain of the bottom transistor $T_E$ are formed by a common N+ doped region 520. The common doped region 520 extends to contact a buried N+ region 522 that forms the common line 400 (FIG. 8) coupling each of the memory cells in two adjacent blocks along two adjacent rows. A floating gate polysilicon or other conductive layer 524 is formed in each memory cell in the upper memory block $302_i$, and a floating gate polysilicon layer 526 is formed in each memory cell in the bottom memory block $302_{i+n}$. The polysilicon layers 524 and 526 form the floating gates for corresponding memory transistors $T_M$. Each of the floating polysilicon layers 524 and 526 overlaps a portion of the buried N+ region 522. The overlapping areas of the polysilicon layers 524 and 526 and the buried N+ region 522 form the corresponding coupling capacitors $C_C$ in each of the memory cell in the upper and lower memory blocks.

The other portions of the memory cells $308_{i,j}$ and $308_{i+n,j}$, including the transistors $T_P$, $T_B$, and the thin oxide transistor $C_T$, in each of the memory blocks are coupled in similar manners as the memory cells $108_{i,j}$ in the embodiment of FIG. 4. However, one difference in the memory cells $308_{i,j}$ and $308_{i+n,j}$ is that the lines 506 and 508 are alternately coupled to the $T_P$ or $T_B$ transistors depending on which row is selected.

By sharing a common line 400, the layout of the memory array 300 according to the embodiment of FIGS. 8 and 9 can further be made more efficient since memory cells may be more densely formed.

Other embodiments are within the scope of the following claims. For example, different types of EEPROMs or flash memories may be implemented with embodiments of the invention. The layout of the memory cells in embodiments of the invention may be modified. The different layers, including conductive layers, insulating layers, oxide layers, and doped regions may be substituted with other types of materials.

While the invention has been disclosed with respect to a limited number of embodiments, those skilled in the art will appreciate numerous modifications and variations therefrom. It is intended that the appended claims cover all such modifications and variations as fall within the true spirit and scope of the invention.

What is claimed is:

1. A memory device comprising:
   a program line and an erase line; and
   a memory cell having first and second depletion-type transistors and a memory transistor having a floating gate;
   the first depletion-type transistor coupled to the program line and the second depletion-type transistor coupled to the erase line,
   wherein the memory cell further includes a tunneling capacitor coupled between a node of the first depletion-type transistor and the floating gate.

2. A memory device comprising:
   a program line and an erase line;
   a memory cell having a first depletion-type transistor and a memory transistor having a floating gate; and
   a second depletion-type transistor,
   the first depletion-type transistor coupled to the program line and the second depletion-type transistor coupled to the erase line.

3. The memory device of claim 2 wherein the program line is capable of being driven to an elevated voltage.

4. The memory device of claim 2, further comprising plural blocks, each block including a plurality of memory cells and a corresponding plurality of program lines.

5. The memory device of claim 4, wherein each block includes the second depletion-type transistor to couple the erase line to the memory cells.

6. The memory device of claim 5, further comprising a common line coupled to the second depletion-type transistor to receive a voltage on the erase line, wherein each memory cell includes a coupling capacitor between the common line and the floating gate of the memory transistor.

7. The memory device of claim 2, further comprising a plurality of program lines and a plurality of erase lines.

8. The memory device of claim 2, wherein the erase line is capable of being driven to an elevated voltage.

9. The memory device of claim 2, further comprising a plurality of erase lines and a plurality of second depletion-type transistors, each erase line capable of being driven to the elevated voltage and associated with a block of memory cells.

10. A method of fabricating a memory device, comprising:
    forming a plurality of memory cells, program lines, and at least one erase line; and
    forming a plurality of first depletion-type transistors coupled to the program lines and the memory cells; and
    forming at least one second deoletion-type transistor coupled to the at least one erase line and one or more memory cells.

11. The method of claim 10, wherein forming the memory cells includes forming single polysilicon memory cells.

12. A semiconductor memory device comprising:
    a conductive line for coupling to an erase voltage;
    a common line;
    a first depletion-type transistor coupled between the conductive line and the common line; and
    a memory transistor having a floating gate capacitively coupled to the common line and having a source electrically coupled to the common line.

13. The semiconductor memory device of claim 12, wherein the memory device includes an electrically erasable and programmable read only memory.

14. The semiconductor memory device of claim 12, wherein the erase voltage is an elevated voltage.

15. The semiconductor memory device of claim 12, further comprising a bit line and an access transistor coupled between the bit line and a node of the memory transistor.

16. The semiconductor memory device of claim 12, further comprising a program line, a tunneling capacitor, and a second transistor coupled between the program line and a node of the tunneling capacitor, another node of the tunneling capacitor coupled to the floating gate.

17. The semiconductor memory device of claim 16, wherein the second transistor includes a depletion-type transistor.

18. The semiconductor memory device of claim 12, wherein the memory transistor is part of a memory cell, the semiconductor memory device further comprising plural memory blocks, each memory block including a plurality of memory cells.

19. The semiconductor memory device of claim 18, further comprising a plurality of conductive lines and a plurality of first deoletion-type transistors, each conductive line and first depletion-type transistor associated with a memory block.

20. A memory device comprising:
    a plurality of memory cells and bit lines, each memory cell including:
    a program line;
    a memory transistor having a floating gate;
    a tunneling capacitor having a first node coupled to the floating gate;
    a depletion-type transistor coupled between the program line and another node of the tunneling capacitor; and
    an access transistor coupled to the memory transistor and a bit line.

21. The memory device of claim 20, wherein the depletion-type transistor includes a depletion-type metal oxide silicon field effect transistor.

22. The memory device of claim 20, further comprising a memory block having a predefined number of memory cells, each memory block including an erase line coupled to each memory cell in the memory block.

23. The memory device of claim 22, wherein each memory block includes a second depletion-type transistor coupled between the erase line and the memory cells in the memory block.

24. The memory device of claim 20, wherein each memory cell is formed of a single-polysilicon structure.

25. A semiconductor device comprising:
    a depletion-type transistor;
    a conductive line coupled to the depletion-type transistor;
    a memory transistor having a first doped region electrically coupled to the conductive line and a floating gate formed by a first layer; and
    a coupling capacitor having a first electrode electrically coupled to the conductive line, a second electrode formed by the first layer, and a dielectric formed by an insulating layer.

26. The semiconductor device of claim 25, comprising a plurality of memory cells each including a memory transistor and a coupling capacitor.

27. The semiconductor device of claim 25, wherein each memory cell includes a single-polysilicon structure.

28. The semiconductor device of claim 25, further comprising a word line and an access transistor controlled by the word line and coupled to the memory transistor, the word line formed of a conductive layer.

29. The semiconductor device of claim 28, wherein the first layer and conductive layer are both formed of the same level of conductive material.

30. The semiconductor device of claim 29, wherein the conductive material includes polysilicon.

31. The semiconductor device of claim 25, wherein the floating gate has a gate capacitance providing a self-boosting effect when a voltage transition occurs on the conductive line.

32. A semiconductor device comprising:
    a conductive line;
    a depletion-type transistor having a first doped region and a second doped region, the first doped region being electrically coupled to the conductive line;
    a memory transistor having a floating gate formed by a first layer containing polysilicon and a third doped region electrically coupled to the second doped region; and
    a coupling capacitor having a first electrode formed by the third doped region, a second electrode formed by the first layer, and a dielectric formed by an insulating layer.

33. A memory device comprising:
    a block of memory cells each including a memory transistor having a source;
    a first doped region forming the source of each memory transistor in the block; and
    a conductive layer above the first doped region, the first doped region and the conductive layer forming plates of a coupling capacitor.

34. The memory device of claim 33, wherein the conductive layer includes polysilicon.

35. The memory device of claim 33, further comprising a plurality of conductive layers above the first doped region, each conductive layer associated with a corresponding memory cell.

36. The memory device of claim 33, further comprising a second doped region, the conductive layer also formed above the second doped region, the second doped region and the conductive layer forming plates of a tunneling capacitor.

37. The memory device of claim 36, wherein each memory transistor has a floating gate, the conductive layer forming the floating gate.

38. The memory device of claim 36, wherein each memory cell includes a program transistor having a source formed by the second doped region.

39. The memory device of claim 38, wherein the program transistor includes a depletion-type transistor.

40. The memory device of claim 33, wherein each memory transistor has a floating gate, the conductive layer forming the floating gate.

41. The memory device of claim 33, further comprising an erase transistor having a source, the source formed by the first doped region.

42. The memory device of claim 41, wherein the erase transistor includes a depletion-type transistor.

43. A method of making a memory device, comprising:
    forming a block of memory cells each including a memory transistor having a source;
    forming a doped region that forms the source of each memory transistor in the block; and
    laying a conductive layer above the doped region, the conductive layer and the doped region forming plates of a coupling capacitor.

* * * * *